United States Patent
Kim

(10) Patent No.: US 9,583,174 B1
(45) Date of Patent: Feb. 28, 2017

(54) SEMICONDUCTOR DEVICES AND SEMICONDUCTOR SYSTEMS

(71) Applicant: SK hynix Inc., Icheon-si, Gyeonggi-do (KR)

(72) Inventor: Young Ran Kim, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/004,321

(22) Filed: Jan. 22, 2016

(30) Foreign Application Priority Data

Sep. 10, 2015 (KR) ........................ 10-2015-0128236

(51) Int. Cl.
| | |
|---|---|
| *G11C 7/10* | (2006.01) |
| *G11C 11/4076* | (2006.01) |
| *G11C 11/4093* | (2006.01) |
| *G11C 11/4091* | (2006.01) |
| *G11C 11/406* | (2006.01) |

(52) U.S. Cl.
CPC ........ *G11C 11/4076* (2013.01); *G11C 11/4091* (2013.01); *G11C 11/4093* (2013.01); *G11C 11/40615* (2013.01); *G11C 11/40626* (2013.01)

(58) Field of Classification Search
CPC ............. G11C 11/4076; G11C 11/4093; G11C 11/4091; G11C 11/40626
See application file for complete search history.

(56) References Cited

U.S. PATENT DOCUMENTS

| 9,343,137 B2* | 5/2016 | Choi | ........................ G11C 7/04 |
| 2010/0109753 A1* | 5/2010 | Lee | ........................ G01K 7/015 |
| | | | 327/513 |
| 2012/0110352 A1 | 5/2012 | Branover et al. | |
| 2015/0348611 A1* | 12/2015 | Rim | .................... G11C 11/4074 |
| | | | 365/222 |
| 2016/0134285 A1* | 5/2016 | Ha | ................... H03K 19/00369 |
| | | | 326/30 |

FOREIGN PATENT DOCUMENTS

KR 1020140060137 A 5/2014

* cited by examiner

*Primary Examiner* — Toan Le
(74) *Attorney, Agent, or Firm* — William Park & Associates Ltd.

(57) ABSTRACT

A semiconductor system may include a first semiconductor device and a second semiconductor device. The first semiconductor device may output command/address signals and receives temperature codes. The second semiconductor device may sense an internal temperature if a combination of the command/address signals is a first combination, generate and output the temperature codes having a combination corresponding to the internal temperature if a combination of the command/address signals is a second combination, and adjust a period of the temperature codes in accordance with a temperature section of the internal temperature.

30 Claims, 11 Drawing Sheets

FIG. 6

|  | COM1 | COM2 | CTRL |
|---|---|---|---|
| FIRST SECTION | L | L | L |
| SECOND SECTION | H | L | H |
| THIRD SECTION | H | H | L |

SEMICONDUCTOR DEVICES AND SEMICONDUCTOR SYSTEMS

CROSS-REFERENCE TO RELATED APPLICATIONS

The present application claims priority under 35 U.S.C. 119(a) to Korean Patent Application No. 10-2015-0128236, filed on Sep. 10, 2015, in the Korean Intellectual Property Office, which is incorporated herein by reference in its entirety as set forth in full.

BACKGROUND

1. Technical Field

Embodiments of the present disclosure generally relate to semiconductor devices and a semiconductor system relating to an internal temperature and temperature codes.

2. Related Art

In the electronics industry, highly integrated fast volatile memory devices such as high performance dynamic random access memory (DRAM) devices widely used as memory devices are increasingly in demand with the development of high performance electronic systems such as personal computers or communication systems. In particular, when semiconductor devices such as the DRAM devices are employed in cellular phones or notebook computers, the semiconductor devices have to be designed to have an excellent low power consumption characteristic. Accordingly, a lot of effort has been focused on reducing operation currents and standby currents of the semiconductor devices.

A data retention characteristic of a DRAM cell including a single transistor and a single storage capacitor may be very sensitive to temperature. Thus, it may be necessary to control operation conditions of internal circuit blocks in a semiconductor device according to variation of an ambient temperature. For example, DRAM devices employed in mobile systems may be designed to control a refresh period according to variation of an ambient temperature. Temperature sensors such as digital temperature sensor regulators (DTSRs) or analog temperature sensor regulators (ATSRs) have been widely used to control the operation conditions of semiconductor devices such as DRAM devices according to variation of the ambient temperature. These temperature sensors may detect a relatively high temperature and may control an operation period to reduce power consumption in a self-refresh mode. Further, the temperature sensors may monitor an ambient temperature in a normal operation mode.

BRIEF DESCRIPTION OF THE DRAWINGS

FIG. 6 is a table illustrating a representation of an example of an operation of a comparison circuit of a temperature sensor included in the semiconductor system of FIG. 1.

DETAILED DESCRIPTION

Figure 1:
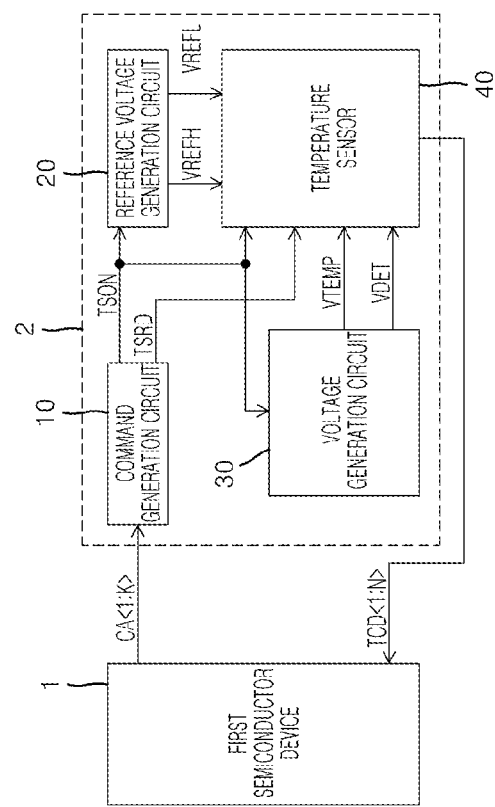
FIG. 1 is a block diagram illustrating a representation of an example of a configuration of a semiconductor system according to an embodiment.

Various embodiments may be directed to semiconductor devices and semiconductor systems.

According to an embodiment, a semiconductor system may include a first semiconductor device and a second semiconductor device. The first semiconductor device may be configured to output command/address signals and receive temperature codes. The second semiconductor device may be configured to sense an internal temperature if a combination of the command/address signals is a first combination, generate and output the temperature codes having a combination corresponding to the internal temperature if a combination of the command/address signals is a second combination, and adjust a period of the temperature codes in accordance with a temperature section of the internal temperature.

According to an embodiment, a semiconductor system may include a first semiconductor device and a second semiconductor device. The first semiconductor device may be configured to output a first command and receive temperature codes. The second semiconductor device may be configured to sense an internal temperature in response to the first command, generate and output the temperature codes having a combination corresponding to the internal temperature in response to the second command, and adjust a period of the temperature codes in accordance with a temperature section of the internal temperature.

According to an embodiment, a semiconductor device may include a command generation circuit suitable for generating a first command which is enabled if a combination of command/address signals is a first combination and may be suitable for generating a second command which is enabled if a combination of the command/address signals is a second combination. The semiconductor device may include a reference voltage generation circuit suitable for generating a first reference voltage and a second reference voltage in response to the first command. The semiconductor device may include a temperature sensor suitable for generating a control signal by comparing a sensing voltage having a level corresponding to an internal temperature with the first and second reference voltages in response to the first command and may be suitable for generating temperature codes. The period of the temperature codes may be adjusted in accordance with a level of the control signal in response to the second command.

According to an embodiment, a semiconductor device may include a command generation circuit configured to receive command/address signals and generate first and second commands based on the command/address signals. The semiconductor device may include a temperature sensor configured to sense and generate temperature codes corresponding to the internal temperature of the semiconductor device based on the first and second commands. The period of the temperature codes may be adjusted in accordance with a temperature section of the internal temperature.

Various embodiments of the present disclosure will be described hereinafter with reference to the accompanying drawings. However, the embodiments described herein are for illustrative purposes only and are not intended to limit the scope of the present disclosure.

Referring to FIG. 1, a semiconductor system according to an embodiment may include a first semiconductor device 1 and a second semiconductor device 2. The second semiconductor device 2 may include a command generation circuit 10, a reference voltage generation circuit 20, a voltage generation circuit 30, and a temperature sensor 40.

The first semiconductor device 1 may output commands/addresses CA<1:K> and may receive temperature codes TCD<1:N>. The command/address signals CA<1:K> may be transmitted through lines that transmit at least one group of addresses, commands and data. In some embodiments, the command/address signals CA<1:K> may be continuously transmitted through one line. The number of bits included in the command/address signals CA<1:K> may be set differently according to the embodiments. The temperature codes TCD<1:N> may be transmitted through lines that transmit at least one group of addresses, commands and data. In some embodiments, the temperature codes TCD<1:N> may be continuously transmitted through one line. The temperature codes TCD<1:N> may be generated to have a level combination corresponding to an internal temperature of the second semiconductor device 2. The number of bits included in the temperature codes TCD<1:N> may be set differently according to the embodiments.

The first semiconductor device 1 may be realized by a controller for controlling an operation of the second semiconductor device 2 or test equipment for testing the second semiconductor device 2. The first semiconductor device 1 may confirm an internal temperature of the second semiconductor device 2 according to the temperature codes TCD<1:N> and may control the operation of the second semiconductor device 2 according to the internal temperature.

The command generation circuit 10 may generate a first command TSON which is enabled if a combination of the command/address signals CA<1:K> is a first combination and may generate a second command TSRD which is enabled if the combination of the command/address signals CA<1:K> is a second combination. The combinations of the command/address signals CA<1:K> for generating the first command TSON and the second command TSRD may be set differently according to the embodiments.

The reference voltage generation circuit 20 may generate a first reference voltage VREFH and a second reference voltage VREFL in response to the first command TSON. The first reference voltage VREFH and the second reference voltage VREFL may be generated to have voltage levels for setting a temperature section. The levels of the first reference voltage VREFH and the second reference voltage VREFL for setting the temperature section will be described later.

The voltage generation circuit 30 may receive the first command TSON to generate a temperature voltage VTEMP. The level of the temperature voltage VTEMP may change according to the internal temperature. The voltage generation circuit 30 may receive the first command TSON to generate a sensing voltage VDET. The level of the sensing voltage VDET may have a level corresponding to the internal temperature. The temperature voltage VTEMP may be set so that a level of the temperature voltage VTEMP changes according to the internal temperature. The temperature voltage VTEMP may be generated to have one of various voltages corresponding to various temperature sections of the internal temperature. The sensing voltage VDET may be generated to have a voltage level for confirming the internal temperature of the second semiconductor device 2.

Figure 3:
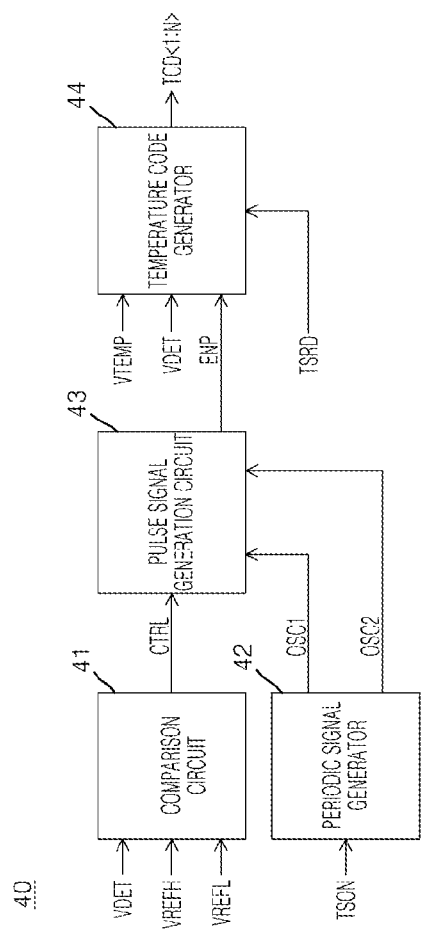
FIG. 3 is a block diagram illustrating a representation of an example of a configuration of a temperature sensor included in the semiconductor system of FIG. 1.

The temperature sensor 40 may generate a control signal (CTRL of FIG. 3) by comparing the sensing voltage VDET having a level corresponding to the internal temperature with the first reference voltage VREFH and the second reference voltage VREFL in response to the first command TSON, may generate a pulse signal (ENP of FIG. 3) whose pulse generation period is adjusted in accordance with a level of the control signal (CTRL of FIG. 3) in response to the second command TSRD, and may generate the temperature codes TCD<1:N> by comparing the temperature voltage VTEMP with the sensing voltage VDET in response to the pulse signal (ENP of FIG. 3). The temperature sensor 40 may be realized by a digital temp sensor regulator (DTSR), an analog temp sensor regulator (ATSR), or the like. The temperature sensor 40 may be realized by an analog to digital converter (ADC) which converts an analog voltage signal into a digital signal.

That is, the second semiconductor device 2 may sense the internal temperature if a combination of the command/address signals CA<1:K> is a first combination and may generate and output the temperature codes TCD<1:N> corresponding to the internal temperature if the combination of the command/address signals CA<1:K> is a second combination. A period of the temperature codes TCD<1:N> may be adjusted in accordance with a temperature section of the internal temperature. For example, the second semiconductor device 2 may generate the temperature codes TCD<1:N> having a first period if the internal temperature is within a range of a predetermined temperature section, and the second semiconductor device 2 may generate the temperature codes TCD<1:N> having a second period if the internal temperature is out of the range of the predetermined temperature section. An operation of adjusting the period of the temperature codes TCD<1:N> in accordance with the temperature sections of the internal temperature will be described later.

Figure 2:
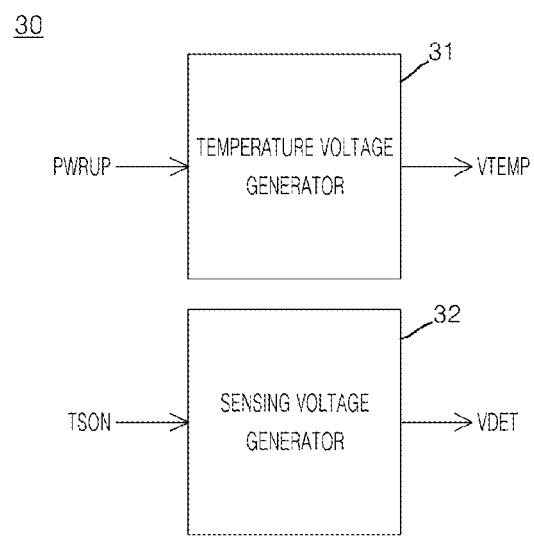
FIG. 2 is a block diagram illustrating a representation of an example of a configuration of a voltage generation circuit included in the semiconductor system of FIG. 1.

Referring to FIG. 2, the voltage generation circuit 30 may include a temperature voltage generator 31 and a sensing voltage generator 32.

The temperature voltage generator 31 may generate the temperature voltage VTEMP. The level of the temperature voltage VTEMP may change according to the internal temperature in response to a power-up signal PWRUP received by the temperature voltage generator 31. The power-up signal PWRUP may be enabled after a power-up section. The temperature voltage generator 31 may be realized to generate the temperature voltage VTEMP and to generate increasing levels of the temperature voltage VTEMP if the internal temperature rises. Alternatively, the temperature voltage generator 31 may be realized to generate decreasing levels of the temperature voltage VTEMP if the internal temperature decreases. The temperature voltage VTEMP may be generated to have a single voltage level or a plurality of voltage levels. Here, the power-up section may correspond to a time section in which a level of an internal voltage increases from a ground voltage to a predetermined voltage level along a power supply voltage supplied from an external system. The power-up signal PWRUP may be set to be a signal which is enabled in an initialization operation that the semiconductor system starts to operate.

The sensing voltage generator 32 may generate the sensing voltage VDET corresponding to the internal temperature in response to the first command TSON.

Referring to FIG. 3, the temperature sensor 40 may include a comparison circuit 41, a periodic signal generator 42, a pulse signal generation circuit 43, and a temperature code generator 44.

The comparison circuit 41 may generate the control signal CTRL by comparing the sensing voltage VDET with the first and second reference voltages VREFH and VREFL. For example, the comparison circuit 41 may generate the control signal CTRL which is enabled if the sensing voltage VDET has a level between a level of the first reference voltage VREFH and a level of the second reference voltage VREFL. The comparison circuit 41 may generate the control signal CTRL which is disabled if the level of the sensing voltage VDET is higher than the level of the first reference voltage VREFH or lower than the level of the second reference voltage VREFL.

The periodic signal generator 42 may generate a first periodic signal OSC1 which is toggled on a first period and a second periodic signal OSC2 which is toggled on a second period, in response to the first command TSON. The first periodic signal OSC1 may be generated to be toggled faster than the second periodic signal OSC2. The first period may be set shorter than the second period. A period of the first periodic signal OSC1 and a period of the second periodic signal OSC2 may be set differently according to the embodiments.

The pulse signal generation circuit 43 may generate the pulse signal ENP including pulses which are generated from the first periodic signal OSC1 or the second periodic signal OSC2 on a first period or a second period, according to a level of the control signal CTRL. For example, the pulse signal generation circuit 43 may generate the pulse signal ENP including pulses which are generated from the first periodic signal OSC1 on a first period if the control signal CTRL is enabled, and the pulse signal generation circuit 43 may generate the pulse signal ENP including pulses which are generated from the second periodic signal OSC2 on a second period if the control signal CTRL is disabled.

The temperature code generator 44 may generate the temperature codes TCD<1:N> by comparing the temperature voltage VTEMP with the sensing voltage VDET whenever the pulses of the pulse signal ENP are generated in response to the second command TSRD. The temperature codes TCD<1:N> may be generated to include a plurality of digital signals including internal temperature information. The temperature code generator 44 may be realized, for example but not limited to, using an analog to digital converter (ADC).

Figure 4:
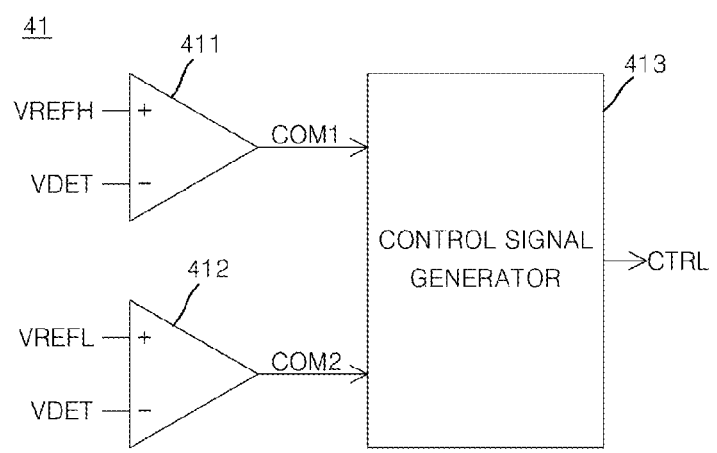
FIG. 4 is a block diagram illustrating a representation of an example of a configuration of a comparison circuit included in the temperature sensor of FIG. 3.

Referring to FIG. 4, the comparison circuit 41 may include a first comparator 411, a second comparator 412, and a control signal generator 413.

The first comparator 411 may generate a first comparison signal COM1 by comparing the sensing voltage VDET with the first reference voltage VREFH. The first comparator 411 may generate the first comparison signal COM1 having a logic low level if a level of the sensing voltage VDET is higher than that of the first reference voltage VREFH. The first comparator 411 may generate the first comparison signal COM1 having a logic high level if a level of the sensing voltage VDET is lower than that of the first reference voltage VREFH. The level of the first comparison signal COM1 which is generated by comparing the sensing voltage VDET with the first reference voltage VREFH may be set differently according to the embodiments.

The second comparator 412 may generate a second comparison signal COM2 by comparing the sensing voltage VDET with the second reference voltage VREFL. The second comparator 412 may generate the second comparison signal COM2 having a logic low level if a level of the sensing voltage VDET is higher than that of the second reference voltage VREFL. The second comparator 412 may generate the second comparison signal COM2 having a logic high level if a level of the sensing voltage VDET is lower than that of the second reference voltage VREFL. The level of the second comparison signal COM2 which is generated by comparing the sensing voltage VDET with the second reference voltage VREFL may be set differently according to the embodiments.

The control signal generator 413 may generate the control signal CTRL which is enabled to a logic high level if a level of the first comparison signal COM1 is different from a level of the second comparison signal COM2. The control signal generator 413 may generate the control signal CTRL which is disabled to a logic low level if the level of the first comparison signal COM1 is the same as the level of the second comparison signal COM2. The level of the control signal CTRL which is generated in accordance with the levels of the first comparison signal COM1 and the second comparison signal COM2 may be set differently according to the embodiments.

The operations of the comparison circuits according to the temperature sections of the internal temperature will be described hereinafter with reference to FIGS. 5 and 6.

Figure 5:
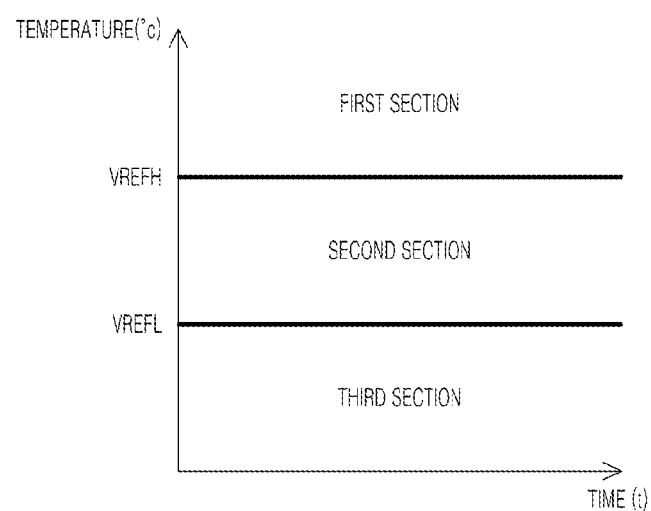
FIG. 5 is a graph illustrating representations of examples of temperature sections of an internal temperature of a second semiconductor device included in the semiconductor system of FIG. 1.

FIG. 5 is a graph illustrating representations of examples of temperature sections of the internal temperature of the second semiconductor device 2 included in the semiconductor system of FIG. 1.

Referring to FIG. 5, a first section of the internal temperature may mean a section that a voltage level corresponding to the internal temperature is higher than the first reference voltage VREFH corresponding to a lower limit of the first section.

A second section of the internal temperature may mean a section that a voltage corresponding to the internal temperature has a level between the first reference voltage VREFH corresponding to an upper limit of the second section and the second reference voltage VREFL corresponding to a lower limit of the second section.

A third section of the internal temperature may mean a section that a voltage level corresponding to the internal temperature is lower than the second reference voltage VREFH corresponding to an upper limit of the third section.

FIG. 6 is a table illustrating operations of the comparison circuit 41 of the temperature sensor 40 included in the semiconductor system of FIG. 1.

First, if the internal temperature is within a range of the first section, the sensing voltage VDET may be generated to have a level which is higher than that of the first reference voltage VREFH.

The first comparator 411 may generate the first comparison signal COM1 having a logic low level by comparing the sensing voltage VDET with the first reference voltage VREFH.

The second comparator 412 may generate the second comparison signal COM2 having a logic low level by comparing the sensing voltage VDET with the second reference voltage VREFL.

Since the logic levels of the first comparison signal COM1 and the second comparison signal COM2 are identical to each other, the control signal generator 413 may generate the control signal CTRL having a logic low level.

Next, if the internal temperature is within a range of the second section corresponding to a predetermined temperature section, the sensing voltage VDET may be generated to have a level between the level of the first reference voltage VREFH and the level of the second reference voltage VREFL.

The first comparator 411 may generate the first comparison signal COM1 having a logic high level by comparing the sensing voltage VDET with the first reference voltage VREFH.

The second comparator 412 may generate the second comparison signal COM2 having a logic low level by comparing the sensing voltage VDET with the second reference voltage VREFL.

Since the logic levels of the first comparison signal COM1 and the second comparison signal COM2 are different from each other, the control signal generator 413 may generate the control signal CTRL having a logic high level.

Next, if the internal temperature is within a range of the third section, the sensing voltage VDET may be generated to have a level which is lower than that of the second reference voltage VREFL.

The first comparator 411 may generate the first comparison signal COM1 having a logic high level by comparing the sensing voltage VDET with the first reference voltage VREFH.

The second comparator 412 may generate the second comparison signal COM2 having a logic high level by comparing the sensing voltage VDET with the second reference voltage VREFL.

Since the logic levels of the first comparison signal COM1 and the second comparison signal COM2 are identical to each other, the control signal generator 413 may generate the control signal CTRL having a logic low level.

Figure 7:
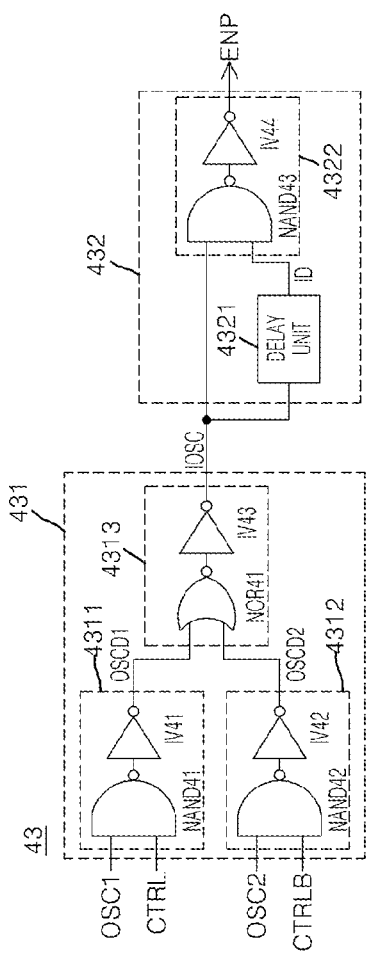
FIG. 7 is a circuit diagram illustrating a representation of an example of a configuration of a pulse signal generation circuit included in the temperature sensor of FIG. 3.

Referring to FIG. 7, the pulse signal generation circuit 43 may include an internal periodic signal generator 431 and a pulse generator 432.

The internal periodic signal generator 431 may include a first logic circuit 4311, a second logic circuit 4312, and a third logic circuit 4313.

The first logic circuit 4311 may include logic gates. For example, the first logic circuit 4311 may be realized to include a NAND gate NAND41 and an inverter IV41 connected to an output terminal of the NAND gate NAND41. The first logic circuit 4311 may generate a first delay periodic signal OSCD1 by performing a NAND operation of the control signal CTRL and the first periodic signal OSC1. That is, if the control signal CTRL has a logic high level, the first logic circuit 4311 may buffer the first periodic signal OSC1 to generate the first delay periodic signal OSCD1. If the control signal CTRL has a logic low level, the first logic circuit 4311 may generate the first delay periodic signal OSCD1 having a logic low level.

The second logic circuit 4312 may include logic gates. For example, the second logic circuit 4312 may be realized to include a NAND gate NAND42 and an inverter IV42 connected to an output terminal of the NAND gate NAND42. The second logic circuit 4312 may generate a second delay periodic signal OSCD2 by performing a NAND operation of an inversed control signal CTRLB and the second periodic signal OSC2. The inversed control signal CTRLB is a complementary signal of the control signal CTRL. That is, if the inversed control signal CTRLB has a logic high level, the second logic circuit 4312 may buffer the second periodic signal OSC2 to generate the second delay periodic signal OSCD2. If the inversed control signal CTRLB has a logic low level, the second logic circuit 4312 may generate the second delay periodic signal OSCD2 having a logic low level.

The third logic circuit 4313 may include logic gates. For example, the third logic circuit 4313 may be realized to include a NOR gate NOR41 and an inverter IV43 connected to an output terminal of the NOR gate NOR41. The third logic circuit 4313 may generate an internal periodic signal IOSC by performing a NOR operation of the first delay periodic signal OSCD1 and the second delay periodic signal OSCD2. That is, the third logic circuit 4313 may generate the internal periodic signal IOSC including pulses which are generated in response to pulses of the first delay periodic signal OSCD1 or the second delay periodic signal OSCD2.

The pulse generator 432 may include a delay unit 4321 and a fourth logic unit 4322.

The delay unit 4321 may generate an internal delay signal ID by reversely delaying the internal periodic signal IOSC.

The fourth logic unit 4322 may include logic gates. For example, the fourth logic unit 4322 may be realized to include a NAND gate NAND43 and an inverter IV44 connected to an output terminal of the NAND gate NAND43. The fourth logic unit 4322 may generate the pulse signal ENP by performing a NAND operation of the internal periodic signal IOSC and the internal delay signal ID. That is, the fourth logic unit 4322 may generate the pulse signal ENP including pulses, each of which is generated to have a logic high level from a point of time that the internal periodic signal IOSC having a logic high level is inputted there to till a point of time that the internal delay signal ID having a logic high level is inputted thereto.

Figure 8:
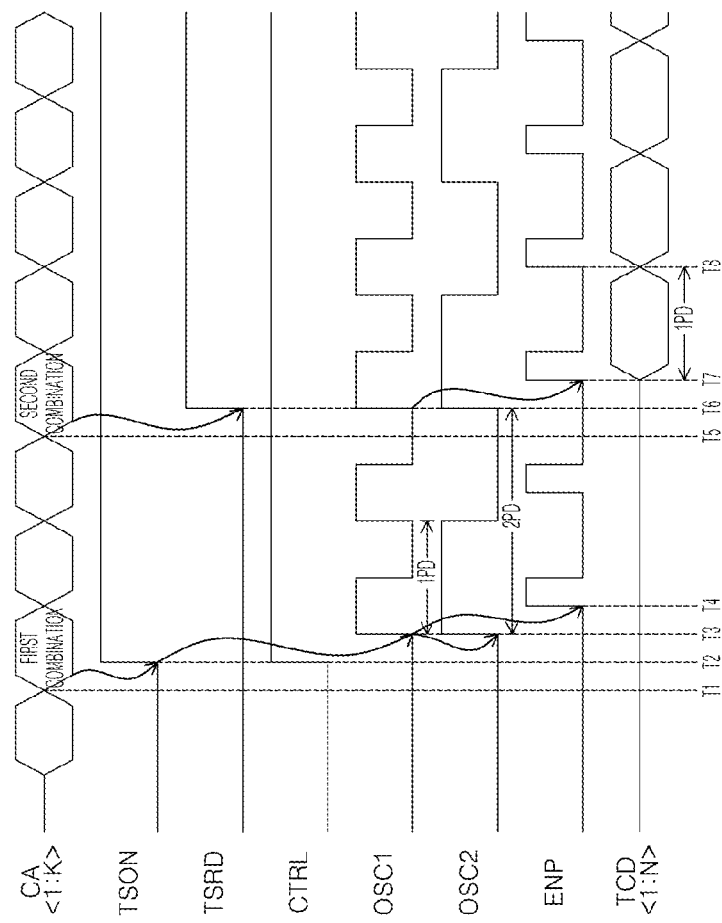
FIG. 8 and FIG. 9 are timing diagrams illustrating representations of examples of operations of the semiconductor system according to an embodiment of the present disclosure.
Figure 9:
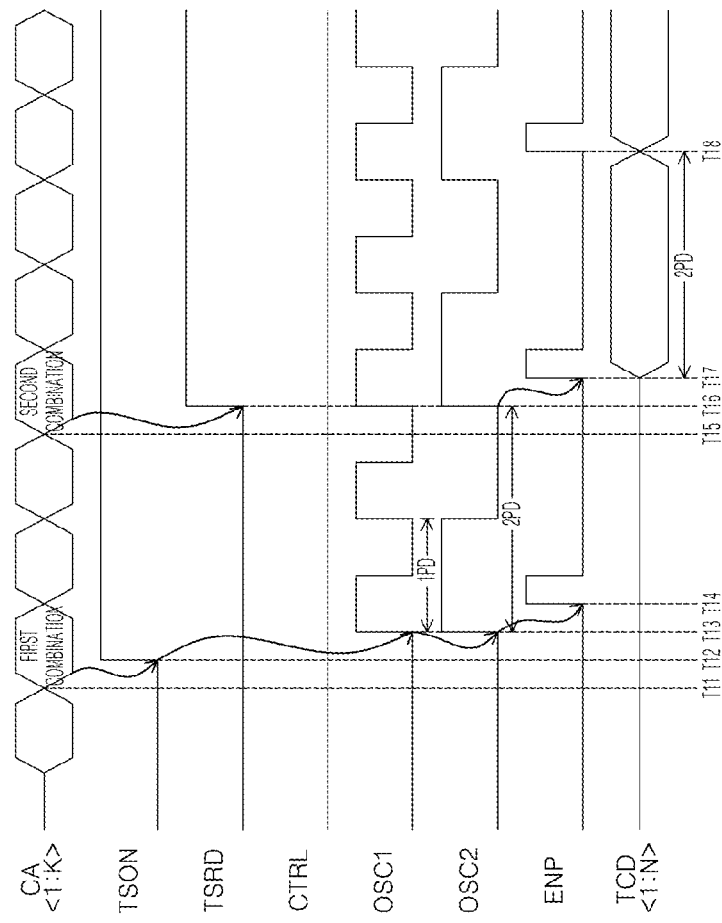

An operation of the semiconductor system having an aforementioned configuration will be described hereinafter with reference to FIGS. 8 and 9 in conjunction with an example in which a voltage level corresponding to the internal temperature is within a range of the second section corresponding to a predetermined temperature section and an example in which a voltage level corresponding to the internal temperature is within a range of the first section.

First, the operation of the semiconductor system will be described hereinafter with reference to FIG. 8 in conjunction with an example in which a voltage level corresponding to the internal temperature is within a range of the second section.

At a point of time T1, the first semiconductor device 1 may output the command/address signals CA<1:K> having a first combination.

At a point of time T2, the command generation circuit 10 may generate the first command TSON which is enabled to a logic high level by the command/address signals CA<1:K> having a first combination that is inputted at the point of time T1.

The reference voltage generation circuit 20 may generate the first reference voltage VREFH and the second reference voltage VREFL in response to the first command TSON having a logic high level.

The voltage generation circuit 30 may generate the temperature voltage VTEMP (the temperature voltage VTEMP level changing according to the internal temperature) and the sensing voltage VDET having a level corresponding to the internal temperature, in response to the first command TSON. In such a case, the sensing voltage VDET may be generated to have a level between the level of the first reference voltage VREFH and the level of the second reference voltage VREFL.

Referring to FIG. 5 and FIG. 6, since a voltage level corresponding to the internal temperature is within a range of the second section corresponding to the predetermined temperature section, the comparison circuit 41 of the temperature sensor 40 may generate the control signal CTRL which is enabled to a logic high level.

At a point of time T3, the periodic signal generator 42 may generate the first periodic signal OSC1 which is toggled on a first period (1PD) and the second periodic signal OSC2 which is toggled on a second period (2PD), in response to the first command TSON which is enabled at the point of time T2.

At a point of time T4, the pulse signal generation circuit 43 may generate the pulse signal ENP including pulses which are generated to have a logic high level on the first period (1PD) from the first periodic signal OSC1 generated at the point of time T3, in response to the control signal CTRL having a logic high level.

At a point of time T5, the first semiconductor device 1 may output the command/address signals CA<1:K> having a second combination.

At a point of time T6, the command generation circuit 10 may generate the second command TSRD which is enabled to a logic high level in response to the command/address signals CA<1:K> of the second combination that are inputted at the point of time T5.

At a point of time T7, the pulse signal generation circuit 43 may generate the pulse signal ENP including pulses which are generated to have a logic high level on the first period (1PD) from the first periodic signal OSC1 generated at the point of time T6.

The temperature code generator 44 may generate the temperature codes TCD<1:N> by comparing the temperature voltage VTEMP with the sensing voltage VDET at a point of time that a pulse of the pulse signal ENP is generated, in response to the second command TSRD.

At a point of time T8, the temperature code generator 44 may generate the temperature codes TCD<1:N> by comparing the temperature voltage VTEMP with the sensing voltage VDET at a point of time in which another pulse of the pulse signal ENP is generated, in response to the second command TSRD.

As described above, if a voltage level corresponding to the internal temperature is within a range of the second section corresponding to the predetermined temperature section, the temperature codes TCD<1:N> may be generated to have the first period (1PD).

The first semiconductor device 1 may confirm the internal temperature of the second semiconductor device 2 in accordance with the temperature codes TCD<1:N> and may control the operation of the second semiconductor device 2 in accordance with the internal temperature.

Next, the operation of the semiconductor system will be described hereinafter with reference to FIG. 9 in conjunction with an example in which a voltage level corresponding to the internal temperature is within a range of the first section that is out of the predetermined temperature section.

At a point of time T11, the first semiconductor device 1 may output the command/address signals CA<1:K> having a first combination.

At a point of time T12, the command generation circuit 10 may generate the first command TSON which is enabled to a logic high level by the command/address signals CA<1:K> having a first combination that are inputted at the point of time T11.

The reference voltage generation circuit 20 may generate the first reference voltage VREFH and the second reference voltage VREFL in response to the first command TSON having a logic high level.

The voltage generation circuit 30 may generate the temperature voltage VTEMP (the level of the temperature voltage VTEMP changing according to the internal temperature) and the sensing voltage VDET having a level corresponding to the internal temperature, in response to the first command TSON. In such a case, the sensing voltage VDET may be generated to have a level which is higher than that of the first reference voltage VREFH.

Referring to FIG. 5 and FIG. 6, since a voltage level corresponding to the internal temperature is within a range of the first section which is out of the predetermined temperature section, the comparison circuit 41 of the temperature sensor 40 may generate the control signal CTRL which is disabled to a logic low level.

At a point of time T13, the periodic signal generator 42 may generate the first periodic signal OSC1 which is toggled on the first period (1PD) and the second periodic signal OSC2 which is toggled on the second period (2PD), in response to the first command TSON which is enabled at the point of time T12.

At a point of time T14, the pulse signal generation circuit 43 may generate the pulse signal ENP including pulses which are generated to have a logic high level on the second period (2PD) from the second periodic signal OSC2 generated at the point of time T13, in response to the control signal CTRL having a logic low level.

At a point of time T15, the first semiconductor device 1 may output the command/address signals CA<1:K> having a second combination.

At a point of time T16, the command generation circuit 10 may generate the second command TSRD which is enabled to a logic high level by the command/address signals CA<1: K> of the second combination that are inputted at the point of time T15.

At a point of time T17, the pulse signal generation circuit 43 may generate the pulse signal ENP including pulses which are generated to have a logic high level on the second period (2PD) from the second periodic signal OSC2 generated at the point of time T16.

The temperature code generator 44 may generate the temperature codes TCD<1:N> by comparing the temperature voltage VTEMP with the sensing voltage VDET at a point of time that a pulse of the pulse signal ENP is generated, in response to the second command TSRD.

At a point of time T18, the temperature code generator 44 may generate the temperature codes TCD<1:N> by comparing the temperature voltage VTEMP with the sensing voltage VDET at a point of time that another pulse of the pulse signal ENP is generated, in response to the second command TSRD.

As described above, if a voltage level corresponding to the internal temperature is within a range of the first section that is out of the predetermined temperature section, the temperature codes TCD<1: N> may be generated to have the second period (2PD).

The first semiconductor device 1 may confirm the internal temperature of the second semiconductor device 2 in accordance with the temperature codes TCD<1:N> and may control the operation of the second semiconductor device 2 in accordance with the internal temperature.

The operation of the semiconductor system when a voltage level corresponding to the internal temperature is within a range of the third section that is out of the predetermined temperature section may be substantially the same as described with reference to FIG. 9. Thus, the operation of the semiconductor system when a voltage level corresponding to the internal temperature is within a range of the third section will be omitted hereinafter.

According to an above embodiment, the semiconductor system may adjust points of time that the temperature codes including the internal temperature information are generated in accordance with the temperature sections of the internal temperature, thereby reducing power consumption. In addition, if the internal temperature is within a range of the predetermined temperature section, a period of the temperature codes including the internal temperature information may be reduced to improve the reliability of the temperature codes.

Figure 10:
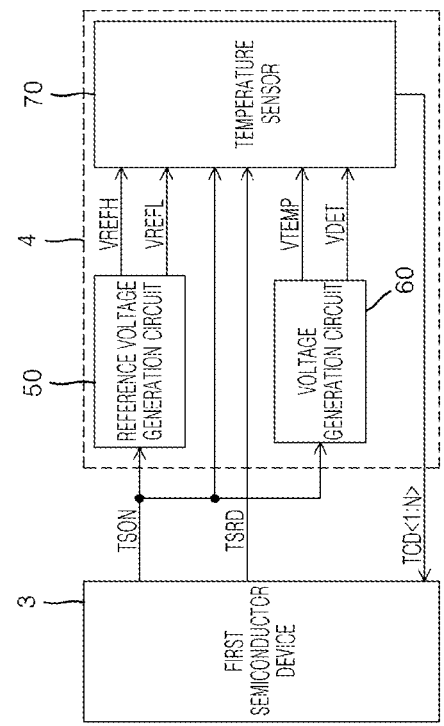
FIG. 10 is a block diagram illustrating a representation of an example of a configuration of a semiconductor system according to an embodiment.

FIG. 10 is a block diagram illustrating a representation of an example of a configuration of a semiconductor system according to an embodiment.

Referring to FIG. 10, a semiconductor system according to an embodiment may include a first semiconductor device 3 and a second semiconductor device 4. The second semiconductor device 4 may include a reference voltage generation circuit 50, a voltage generation circuit 60, and a temperature sensor 70.

The first semiconductor device 3 may output a first command TSON and a second command TSRD and may receive temperature codes TCD<1:N>. The first command TSON and the second command TSRD may be transmitted through lines that transmit at least one group of addresses, commands, and data. In some embodiments, the first command TSON and the second command TSRD may be continuously transmitted through a single line. Temperature codes TCD<1:N> may be transmitted through lines that transmit at least one group of addresses, commands, and data. In some embodiments, the temperature codes TCD<1:N> may be continuously transmitted through one line. The temperature codes TCD<1:N> may be generated to have a level combination corresponding to an internal temperature of the second semiconductor device 4. The number of bits included in the temperature codes TCD<1:N> may be set differently according to the embodiments.

The first semiconductor device 3 may be realized using a controller for controlling an operation of the second semiconductor device 4 or a test equipment for testing the second semiconductor device 4. The first semiconductor device 3 may confirm the internal temperature of the second semiconductor device 4 according to the temperature codes TCD<1:N> and may control the operation of the second semiconductor device 4 according to the internal temperature of the second semiconductor device 4.

The reference voltage generation circuit 50 may generate a first reference voltage VREFH and a second reference voltage VREFL in response to the first command TSON. The reference voltage generation circuit 50 may be realized to have the same configuration as the reference voltage generation circuit 20 described with reference to FIG. 1. Thus, a detailed description of the reference voltage generation circuit 50 will be omitted hereinafter.

The voltage generation circuit 60 may generate a temperature voltage VTEMP whose level changes according to the internal temperature and a sensing voltage VDET having a level corresponding to the internal temperature, in response to the first command TSON. The voltage generation circuit 60 may be realized to have the same configuration as the voltage generation circuit 30 illustrated in FIG. 1. Thus, a detailed description of the voltage generation circuit 60 will be omitted hereinafter.

The temperature sensor 70 may generate a control signal by comparing the sensing voltage VDET having a level corresponding to the internal temperature with the first reference voltage VREFH and the second reference voltage VREFL in response to the first command TSON, may generate a pulse signal (The pulse generation period is adjusted in accordance with a level of the control signal in response to the second command TSRD), and may generate the temperature codes TCD<1:N> by comparing the temperature voltage VTEMP with the sensing voltage VDET in response to the pulse signal. The temperature sensor 70 may be realized using a digital temp sensor regulator (DTSR), an analog temp sensor regulator (ATSR), or the like. In some embodiments, the temperature sensor 70 may be realized using an analog to digital converter (ADC) which converts an analog voltage into a digital signal. The temperature sensor 70 may be realized to have the same configuration as the temperature sensor 40 illustrated in FIG. 1. Thus, a detailed description of the temperature sensor 70 will be omitted hereinafter.

For example, the second semiconductor device 4 may sense the internal temperature in response to the first command TSON and may generate and output the temperature codes TCD<1:N> corresponding to the internal temperature in response to the second command TSRD. A period of the temperature codes TCD<1:N> may be adjusted in accordance with temperature sections of the internal temperature. The second semiconductor device 4 may generate the temperature codes TCD<1:N> on a first period if a voltage level corresponding to the internal temperature is within a range of a temperature section corresponding to a predetermined temperature section, and the second semiconductor device 4 may generate the temperature codes TCD<1:N> on a second period if the voltage level corresponding to the internal temperature is out of the range of the predetermined temperature section.

The semiconductor system having the configuration illustrated in FIG. 10 may adjust points of time that the temperature codes including the internal temperature information are generated in accordance with the temperature sections of the internal temperature, thereby reducing power consumption. In addition, if the internal temperature is within a range of the predetermined temperature section, a period of the temperature codes including the internal temperature information may be reduced to improve the reliability of the temperature codes.

Figure 11:
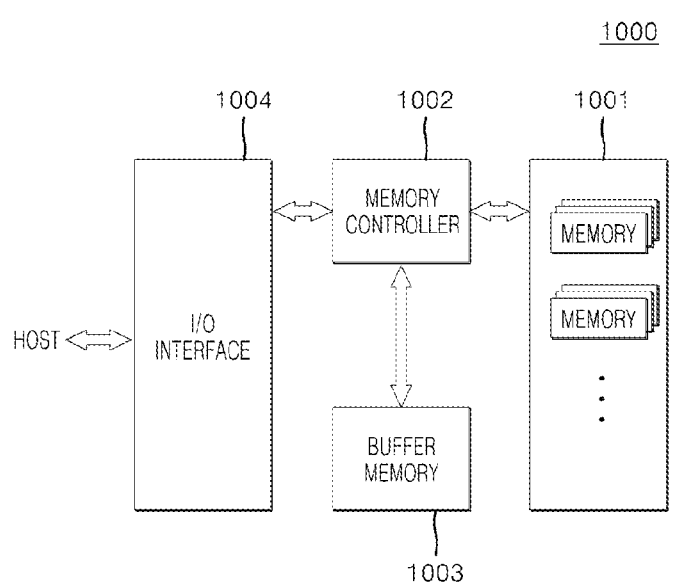
FIG. 11 is a block diagram illustrating a representation of an example of a configuration of an electronic system including at least one of the semiconductor devices or the semiconductor systems illustrated in FIGS. 1 to 10.

At least one of the semiconductor devices or at least one of the semiconductor systems described with reference to FIGS. 1 to 10 may be applied to an electronic system that includes a memory system, a graphic system, a computing system, a mobile system, or the like. For example, an electronic system 1000 according to an embodiment may include a data storage unit 1001, a memory controller 1002, a buffer memory 1003, and an input/output (I/O) interface 1004, as illustrated in FIG. 11.

The data storage unit 1001 may store data which are outputted from the memory controller 1002 or may read and output the stored data to the memory controller 1002, according to a control signal generated from the memory controller 1002. The data storage unit 1001 may include the second semiconductor device 2 illustrated in FIG. 1 or the second semiconductor device 4 illustrated in FIG. 10. The data storage unit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage unit 1001 or the buffer memory 1003 or for outputting the data stored in the data storage unit 1001 or the buffer memory 1003. The memory controller 1002 may include the first semiconductor device 1 illustrated in FIG. 1 or the first semiconductor device 3 illustrated in FIG. 10. Although FIG. 11 illustrates the memory controller 1002 with a single block, the memory controller 1002 may include one controller for controlling the data storage unit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage unit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor system comprising:
    a first semiconductor device suitable for outputting command/address signals and suitable for receiving temperature codes; and
    a second semiconductor device suitable for sensing an internal temperature if a combination of the command/address signals is a first combination, suitable for generating and outputting the temperature codes having a combination corresponding to the internal temperature if a combination of the command/address signals is a second combination, and suitable for adjusting a period of the temperature codes in accordance with a temperature section of the internal temperature.

2. The system of claim 1, wherein the period of the temperature codes are reduced if the internal temperature is within a range of a predetermined temperature section.

3. The system of claim 1,
    wherein, the second semiconductor device generates the temperature codes having a first period if the internal temperature is within a range of a predetermined temperature section; and
    wherein the second semiconductor device generates the temperature codes having a second period if the internal temperature is out of the range of the predetermined temperature section.

4. The system of claim 3, wherein the first period is shorter than the second period.

5. The system of claim 3, wherein the second semiconductor device includes:
    a command generation circuit suitable for generating a first command which is enabled if a combination of the command/address signals is the first combination and suitable for generating a second command which is enabled if a combination of the command/address signals is the second combination;
    a reference voltage generation circuit suitable for generating a first reference voltage and a second reference voltage for setting the predetermined temperature section in response to the first command; and
    a temperature sensor suitable for generating a control signal by comparing a sensing voltage having a level corresponding to the internal temperature with the first and second reference voltages in response to the first command, suitable for generating a pulse signal, a toggle period of the pulse signal is adjusted in accordance with a level of the control signal in response to the second command, and suitable for generating the temperature codes by comparing a temperature voltage with the sensing voltage in response to the pulse signal.

6. The system of claim 5, wherein the predetermined temperature section is set to have a voltage range between the first reference voltage and the second reference voltage.

7. The system of claim 5, wherein the second semiconductor device further includes a voltage generation circuit which is suitable for generating the temperature voltage, a level of the temperature voltage changing in accordance with the internal temperature, and suitable for generating the sensing voltage, in response to the first command.

8. The system of claim 7, wherein the voltage generation circuit includes:
    a temperature voltage generator suitable for generating the temperature voltage in response to a power-up signal which is enabled after a power-up section; and
    a sensing voltage generation circuit suitable for generating the sensing voltage having a level corresponding to the internal temperature in response to the first command.

9. The system of claim 5, wherein the temperature sensor includes:
    a comparison circuit suitable for generating the control signal which is enabled if the sensing voltage has a level between a level of the first reference voltage and a level of the second reference voltage;

a periodic signal generator suitable for generating a first periodic signal which is toggled on a first period and a second periodic signal which is toggled on a second period, in response to the first command;

a pulse signal generation circuit suitable for generating the pulse signal including pulses which are generated on the first period or on the second period from the first or second periodic signal, in response to the control signal; and a temperature code generator suitable for generating the temperature codes by comparing the temperature voltage with the sensing voltage whenever the pulses of the pulse signal are generated, in response to the second command.

10. The system of claim 9, wherein the control signal is disabled if the level of the sensing voltage is higher than the level of the first reference voltage or lower than the level of the second reference voltage.

11. The system of claim 9, wherein the comparison circuit includes;

a first comparator suitable for generating a first comparison signal by comparing the sensing voltage with the first reference voltage;

a second comparator suitable for generating a second comparison signal by comparing the sensing voltage with the second reference voltage; and a control signal generator suitable for generating the control signal which is enabled if levels of the first comparison signal and the second comparison signal are different from each other.

12. The system of claim 9, wherein the pulse signal generation circuit includes:

an internal periodic signal generator suitable for outputting the first periodic signal or the second periodic signal as an internal periodic signal in response to the control signal; and a pulse generator suitable for generating the pulse signal including pulses, each of which is generated during a predetermined section at a point of time that a pulse of the internal periodic signal is generated.

13. The system of claim 12, wherein the internal periodic signal generator includes:

a first logic circuit suitable for generating a first delay periodic signal by buffering the first periodic signal if the control signal is enabled;

a second logic circuit suitable for generating a second delay periodic signal by buffering the second periodic signal if the control signal is disabled; and a third logic circuit suitable for generating the internal periodic signal including pulses which are generated in response to pulses of the first delay periodic signal or the second delay periodic signal.

14. A semiconductor system comprising:

a first semiconductor device suitable for outputting a first command and suitable for receiving temperature codes; and a second semiconductor device suitable for sensing an internal temperature in response to the first command, suitable for generating and outputting the temperature codes having a combination corresponding to the internal temperature in response to a second command, and suitable for adjusting a period of the temperature codes in accordance with a temperature section of the internal temperature.

15. The system of claim 14, wherein the period of the temperature codes are reduced if the internal temperature is within a range of a predetermined temperature section.

16. The system of claim 14, wherein the second semiconductor device generates the temperature codes on a first period if the internal temperature is within a range of a predetermined temperature section; and wherein the second semiconductor device generates the temperature codes on a second period if the internal temperature is out of the range of the predetermined temperature section.

17. The system of claim 16, wherein the first period is shorter than the second period.

18. The system of claim 16, wherein the second semiconductor device includes:

a reference voltage generation circuit suitable for generating a first reference voltage and a second reference voltage for setting the predetermined temperature section in response to the first command;

a voltage generation circuit suitable for generating the temperature voltage whose level changes according to the internal temperature and suitable for generating a sensing voltage having a level corresponding to the internal temperature, in response to the first command; and a temperature sensor suitable for generating a control signal by comparing the sensing voltage with the first and second reference voltages in response to the first command, suitable for generating a pulse signal whose toggle period is adjusted in accordance with a level of the control signal in response to the second command, and suitable for generating the temperature codes by comparing the temperature voltage with the sensing voltage in response to the pulse signal.

19. The system of claim 18, wherein the predetermined temperature section is set to have a voltage range between the first reference voltage and the second reference voltage.

20. The system of claim 18, wherein the voltage generation circuit includes:

a temperature voltage generator suitable for generating the temperature voltage in response to a power-up signal which is enabled after a power-up section; and a sensing voltage generator suitable for generating the sensing voltage having a level corresponding to the internal temperature in response to the first command.

21. The system of claim 18, wherein the temperature sensor includes:

a comparison circuit suitable for generating the control signal which is enabled if the sensing voltage has a level between a level of the first reference voltage and a level of the second reference voltage;

a periodic signal generator suitable for generating a first periodic signal which is toggled on a first period and a second periodic signal which is toggled on a second period, in response to the first command;

a pulse signal generation circuit suitable for generating the pulse signal including pulses which are generated on the first period or on the second period from the first or second periodic signal, in response to the control signal; and a temperature code generator suitable for generating the temperature codes by comparing the temperature voltage with the sensing voltage whenever the pulses of the pulse signal are generated, in response to the second command.

22. The system of claim 21, wherein the control signal is disabled if the level of the sensing voltage is higher than the level of the first reference voltage or lower than the level of the second reference voltage.

23. The system of claim 21, wherein the comparison circuit includes;
- a first comparator suitable for generating a first comparison signal by comparing the sensing voltage with the first reference voltage;
- a second comparator suitable for generating a second comparison signal by comparing the sensing voltage with the second reference voltage; and
- a control signal generator suitable for generating the control signal which is enabled if levels of the first comparison signal and the second comparison signal are different from each other.

24. The system of claim 21, wherein the pulse signal generation circuit includes:
- an internal periodic signal generator suitable for outputting the first periodic signal or the second periodic signal as an internal periodic signal in response to the control signal; and
- a pulse generator suitable for generating the pulse signal including pulses, each of which is generated during a predetermined section at a point of time that a pulse of the internal periodic signal is generated.

25. The system of claim 24, wherein the internal periodic signal generator includes:
- a first logic circuit suitable for generating a first delay periodic signal by buffering the first periodic signal if the control signal is enabled;
- a second logic circuit suitable for generating a second delay periodic signal by buffering the second periodic signal if the control signal is disabled; and
- a third logic circuit suitable for generating the internal periodic signal including pulses which are generated in response to pulses of the first delay periodic signal or the second delay periodic signal.

26. A semiconductor device comprising:
- a command generation circuit suitable for receiving command/address signals and generating first and second commands based on the command/address signals;
- a temperature sensor suitable for sensing an internal temperature and generating temperature codes corresponding to the internal temperature of the semiconductor device based on the first and second commands,
wherein a period of the temperature codes is adjusted in accordance with a temperature section of the internal temperature.

27. The semiconductor device of claim 26,
wherein the temperature sensor suitable for generating the temperature codes having a first period if the internal temperature is within a range of a predetermined temperature section, and
wherein the temperature sensor suitable for generating the temperature codes having a second period if the internal temperature is outside of the range of the predetermined temperature section.

28. The semiconductor device of claim 27, wherein the first period is shorter than the second period.

29. The semiconductor device of claim 26, wherein the period of the temperature codes are reduced if the internal temperature is within a range of a predetermined temperature section.

30. The semiconductor device of claim 26, further comprising:
- a reference voltage generation circuit suitable for generating a first reference voltage and a second reference voltage in response to the first command,
wherein the temperature sensor suitable for generating a control signal by comparing a sensing voltage having a level corresponding to the internal temperature with the first and second reference voltages in response to the first command and generate the temperature codes.

* * * * *